US012740185B2

(12) United States Patent
Nishino et al.

(10) Patent No.: US 12,740,185 B2
(45) Date of Patent: Sep. 15, 2026

(54) METHOD FOR MANUFACTURING LIGHT-EMITTING DEVICE

(71) Applicant: NICHIA CORPORATION, Anan (JP)

(72) Inventors: Koji Nishino, Tokushima (JP); Yoshinori Kashima, Anan (JP); Noriyuki Nakashima, Anan (JP); Kenta Nishii, Tokushima (JP); Masaki Nagao, Anan (JP)

(73) Assignee: NICHIA CORPORATION, Anan (JP)

(*) Notice: Subject to any disclaimer, the term of this patent is extended or adjusted under 35 U.S.C. 154(b) by 457 days.

(21) Appl. No.: 18/485,745

(22) Filed: Oct. 12, 2023

(65) Prior Publication Data

US 2024/0178343 A1 May 30, 2024

(30) Foreign Application Priority Data

Nov. 29, 2022 (JP) ................................ 2022-190117

(51) Int. Cl.
*H01L 21/00* (2006.01)
*H10H 20/01* (2025.01)

(52) U.S. Cl.
CPC ... *H10H 20/01335* (2025.01); *H10H 20/0361* (2025.01)

(58) Field of Classification Search
CPC ............... H10H 20/018; H10H 20/036; H10H 20/0362; H10H 20/856; H10H 20/85; H10H 20/0361; H10H 20/8512; H10H 20/852; H10H 29/10; H10H 20/851; H10H 20/812; H10H 20/013; H10H 29/142; H10H 20/841; H10H 20/019; H10H 20/835; H10H 29/24; H10H 20/81; H10H 20/813; H10H 20/8513; H10H 29/20; H10H 20/0133; H10H 20/821; H10H 29/851; H10H 29/0363; H10H 29/8513; H10H 29/852; H10H 29/856; H10H 20/8131; H10H 20/8508; H10H 20/01335; H01H 20/01335
See application file for complete search history.

(56) References Cited

U.S. PATENT DOCUMENTS

2011/0298004 A1 12/2011 Matsuda et al.
2013/0200413 A1 8/2013 Kashiwagi et al.
(Continued)

FOREIGN PATENT DOCUMENTS

JP 2011-138831 A 7/2011
JP 2011-233552 A 11/2011
(Continued)

*Primary Examiner* — Niki H Nguyen
(74) *Attorney, Agent, or Firm* — Kim & Stewart LLP

(57) ABSTRACT

A method for manufacturing the light-emitting device includes: preparing a substrate including a plurality of light-emitting elements disposed in an element placement region of the substrate that is on an upper surface; disposing a light-transmissive member to cover the plurality of light-emitting elements, the light-transmissive member having a rectangular shape in a plan view and being uncured, and pressing one or more corner regions of the light-transmissive member, such that a part of a lower surface of the light-transmissive member is in contact with the upper surface of the substrate outside the element placement region; and curing the light-transmissive member after pressing the one or more corner regions.

18 Claims, 11 Drawing Sheets

(56) References Cited

U.S. PATENT DOCUMENTS

2015/0041841 A1 2/2015 Basin et al.
2018/0226385 A1 * 8/2018 Nakabayashi ........ H10W 90/00
2019/0067536 A1 * 2/2019 Oka .................. H10H 20/8514
2019/0165218 A1 * 5/2019 Nakai ................ H10H 20/8506
2019/0305177 A1 * 10/2019 Takamatsu ............ H10H 20/01
2022/0231205 A1 7/2022 Matsushima et al.

FOREIGN PATENT DOCUMENTS

JP 2011-258634 A 12/2011
JP 2013-159003 A 8/2013
JP 2013-159004 A 8/2013
JP 2017-163104 A 9/2017
JP 2017-163105 A 9/2017
JP 2021-009898 A 1/2021
JP 2022-109528 A 7/2022

* cited by examiner

METHOD FOR MANUFACTURING LIGHT-EMITTING DEVICE

CROSS-REFERENCE TO RELATED APPLICATIONS

This application is based on and claims priority to Japanese Patent Application No. 2022-190117, filed on Nov. 29, 2022, the entire contents of which are incorporated herein by reference.

FIELD

The present disclosure relates to a method for manufacturing a light-emitting device.

BACKGROUND

JP-A 2021-009898 discloses a light-emitting device in which a plurality of light-emitting elements are arranged on a submount. The submount is further mounted on a wiring substrate, and the submount and the wiring substrate are connected to each other by wires.

SUMMARY

An object of one or more embodiments according to the present disclosure is to provide a method for manufacturing a light-emitting device with higher reliability.

A method for manufacturing a light-emitting device according to an embodiment of the present disclosure includes: preparing a substrate including a plurality of light-emitting elements disposed in an element placement region of the substrate that is on an upper surface thereof; disposing a light-transmissive member to cover the plurality of light-emitting elements, the light-transmissive member having a rectangular shape in a plan view and being uncured, after said disposing the light-transmissive member, pressing one or more corner regions of the light-transmissive member, such that a part of a lower surface of the light-transmissive member is in contact with the upper surface of the substrate outside the element placement region; and after said pressing the one or more corner regions, curing the light-transmissive member.

According to at least an embodiment of the present disclosure, a light-emitting device with higher reliability can be provided.

DETAILED DESCRIPTION

Figure 1:
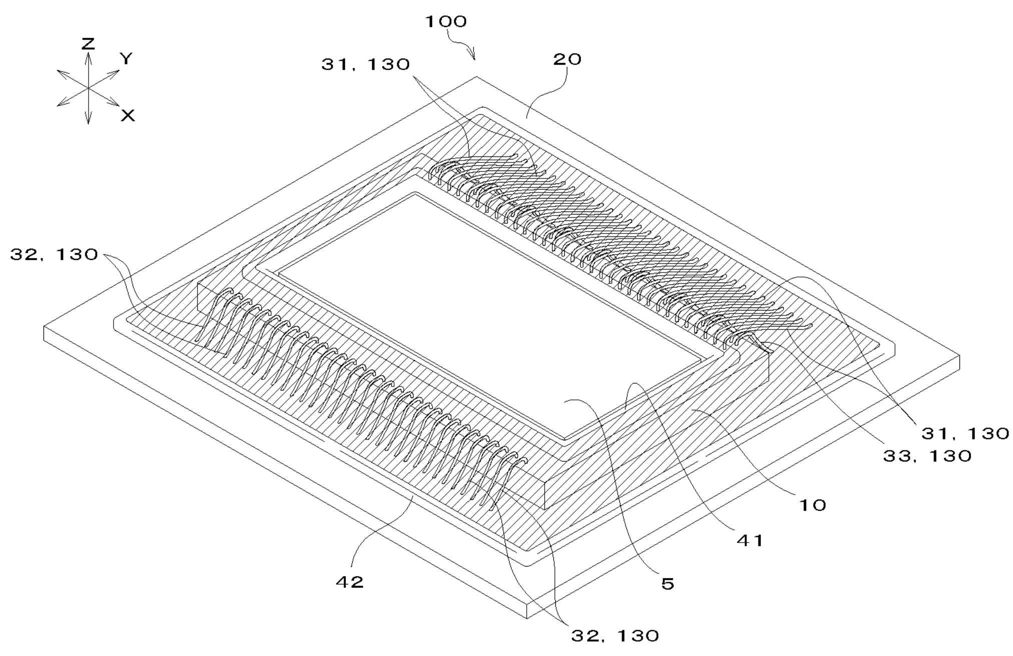
FIG. 1 schematically illustrates a perspective view of a light-emitting device according to an embodiment.

A light-emitting device according to an embodiment is described below with reference to the drawings. The size, positional relationship, or the like of members illustrated in the drawings may be exaggerated for clarity of description. Furthermore, the dimensions and placement positions of the members in a plan view and a corresponding cross-sectional view may not strictly match. In order to avoid excessive complication of the drawings, some elements may not be illustrated, or an end view illustrating only a cut surface may be used as a cross-sectional view. Moreover, in the following description, up and down are relative and do not indicate absolute directions. Also, members having the same names and reference characters, as a rule, represent the same members or members of the same quality, and detailed description thereof may be omitted as appropriate. Furthermore, in the present description, "covering" and "cover" include not only a case of covering by direct contact, but also include a case of indirectly covering, for example, via another member. In the present description, a plan view means observing from an upper surface side of a light-emitting device.

Configuration of Light-Emitting Device

A configuration of a light-emitting device according to the present embodiment is described with reference to FIGS. 1 to 7.

A light-emitting device 100 includes a plurality of light-emitting elements 1, a first substrate 10 including, on an upper surface thereof, an element placement region 13 where the plurality of light-emitting elements 1 are disposed, a light-transmissive member 5 that covers the plurality of light-emitting elements 1, and a first covering member 41 that is continuously provided on the upper surface of the first substrate 10 and on an upper surface of the light-transmissive member 5 and is disposed along the outer edges of the upper surface of the light-transmissive member 5. The light-emitting device 100 further includes a second substrate 20 including, on an upper surface thereof, a substrate placement region 23 where the first substrate 10 is placed, first terminals 110 disposed on the upper surface of a portion of the first substrate 10 located outside the element placement region 13, second terminals 120 disposed on an upper surface of a portion of the second substrate 20 located outside the substrate placement region 23, wires 130 that connect the corresponding first terminals 110 and the corresponding second terminals 120, and a resin member 40 that covers the wires 130. The light-emitting device 100 further includes a reflective member 7 that is provided so as to expose the upper surface of the light-emitting element 1 and cover the lateral surface of the light-emitting element 1 in the element placement region 13, and a second covering member 42 that is disposed outside the second terminals 120 on the upper surface of the second substrate 20 and is in contact with the resin member 40.

A configuration of each element of the light-emitting device 100 is described below.

Figure 2:
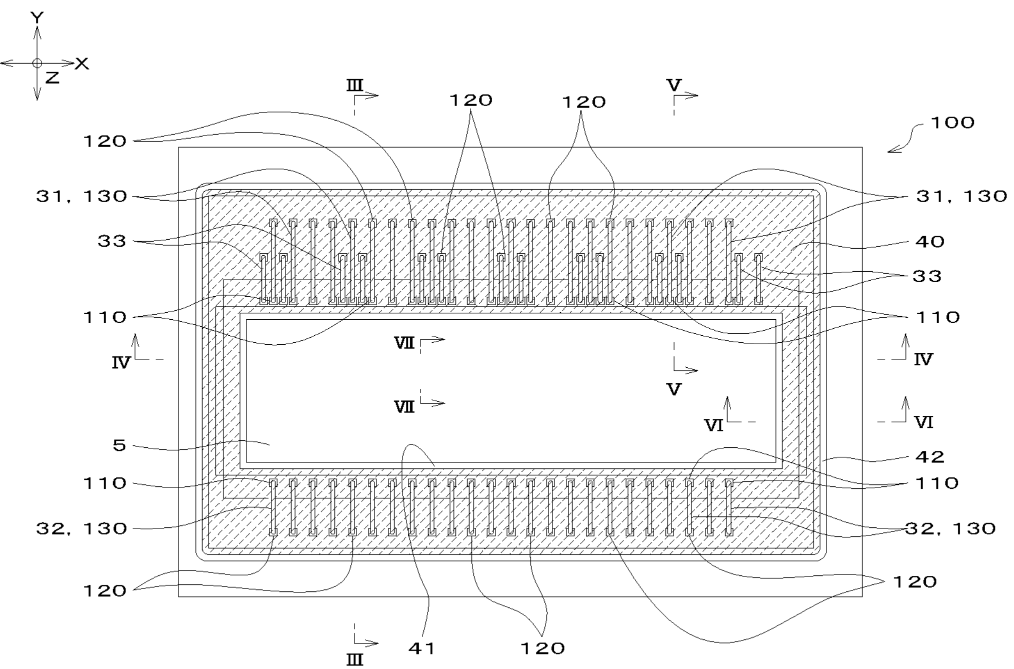
FIG. 2 schematically illustrates a plan view of the light-emitting device according to the embodiment.

As illustrated in FIGS. 1 and 2, the first substrate 10 includes a support member having a flat plate shape and the first terminals 110 disposed on an upper surface of the support member. The upper surface of the first substrate 10 includes the element placement region 13 where the plurality of light-emitting elements 1 are placed. Wiring lines connected to the light-emitting element 1 may be disposed in the element placement region 13. A plurality of first terminals 110 located outside the element placement region 13 are disposed on the upper surface of the first substrate 10. One first terminal 110 is electrically connected to one of the wiring lines disposed in the element placement region 13. The first substrate 10 is, for example, a semiconductor substrate such as silicon. A region of the upper surface of the first substrate 10 where no wiring line is disposed is covered with an insulating film. The wiring line may also be disposed in the interior or on the lower surface of the support member. Examples of the first terminals 110 and the wiring lines that can be used include a metal such as Cu, Ag, Au, Al, Pt, Ti, W, Pd, Fe, and Ni, or an alloy thereof. An example of the first substrate 10 that can be used includes an integrated circuit (IC) substrate in which circuits for controlling the drive of the plurality of light-emitting elements 1 are integrated.

The plurality of light-emitting elements 1 are arranged in a matrix shape in the element placement region 13. In a plan view, the element placement region 13 is, for example, a region having a rectangular shape. In case the planar view shape of the element placement region 13 is a rectangular shape having a long side and a short side, for example, the length of the long side can be in a range from 8 mm to 18 mm and the length of the short side can be in a range from 2 mm to 6 mm. In the direction along the short side of the first substrate 10, the element placement region 13 is located between two groups of first terminals 110 on both sides.

The first terminals 110 include a power supply terminal of the first substrate 10. As illustrated in FIGS. 1 and 2, the planar view shape of the first terminal 110 is, for example, rectangular, circular, or elliptical. A plurality of first terminals 110 in each group are spaced apart from one another on the upper surface of the first substrate 10 and disposed along the long side of the element placement region 13.

Each of the plurality of light-emitting elements 1 is electrically connected to one of the first terminals 110. It is noted that a group of light-emitting elements 1 may be connected in series or in parallel with the corresponding first terminal 110.

As illustrated in FIGS. 1 and 2, the second substrate 20 includes a base body having a flat plate shape and wiring lines disposed on an upper surface of the base body. The upper surface of the second substrate 20 includes the substrate placement region 23 where the first substrate 10 is placed. A plurality of second terminals 120 are located outside the substrate placement region 23 and disposed on the upper surface of the second substrate 20.

The substrate placement region 23 is a region having substantially the same area as that of the planar view shape of the first substrate 10. For example, in case the planar view shape of the first substrate 10 is rectangular, the planar view shape of the substrate placement region 23 can also be rectangular having substantially the same area as that of the first substrate 10. The meaning of "substantially the same" includes an allowable range of errors caused by member tolerances and mounting tolerances.

A planar view shape of the second terminal 120 is, for example, rectangular, circular, or elliptical. The plurality of second terminals 120 are spaced apart from one another on the upper surface of the second substrate 20 and disposed along the long side of the substrate placement region 23. Each of the wires 130 is electrically connected to one of the first terminals 110 and one of the second terminals 120, so that the first substrate 10 and the second substrate 20 are electrically connected to each other. Examples of the second terminal 120 that can be used include the same metal material as that of the first terminal 110 described above.

For the base body, a material having high heat dissipation is preferably used, and a material having a high light shielding property and base body strength is more preferably used. Examples of the base body that can be used include ceramics such as alumina, aluminum nitride, and mullite, resins such as phenol resin, epoxy resin, polyimide resin, bismaleimide triazine (BT) resin, and polyphthalamide (PPA), metals such as Cu and Al, and composite materials configured by resin and metal or ceramics. For the base body, for example, one formed on an upper surface thereof with a cavity may be used. In this case, the substrate placement region of the second substrate 20 can be at the bottom of the cavity, and the first substrate 10 can be placed inside the cavity. The second substrate 20 may include a wiring line for placing the first substrate 10 on the surface of the substrate placement region 23. The first substrate 10 and the second substrate 20 can be bonded to each other via a bonding material such as a sintered body including Ag, solder, and resin.

Examples of the wires 130 that can be used include metals such as Au, Cu, Pt, and Al and/or an alloy containing at least these metals. In particular, the wires 130 using Au with excellent heat resistance and the like is preferably used. A diameter of the wire 130 is in a range from 15 μm to 50 μm, for example. The wires 130 include a first wire 31, a second wire 32, and a third wire 33 with different lengths. Similar metal materials can be used for the first wire 31, the second wire 32, and the third wire 33. The wires 130 are disposed across the long side of the first substrate 10 having a substantially rectangular shape in a plan view. The wires 130 can be disposed substantially orthogonal to the long side of the first substrate 10, for example.

A planar view shape of the light-emitting element 1 is, for example, rectangular. One side of the light-emitting element 1 can be in a range from 40 μm to 100 μm, for example. The light-emitting element 1 has a semiconductor layered body and positive and negative electrodes disposed on a surface of the semiconductor layered body. The light-emitting element 1 includes the positive and negative electrodes disposed on the same surface of the semiconductor layered body and is mounted on the first substrate 10 in a state in which the surface of the semiconductor layered body where the electrodes are disposed faces the upper surface of the first substrate 10. In this case, a surface of the semiconductor layered body opposite to the surface of the semiconductor layered body where the electrodes are disposed serves as a main light emission surface of the light-emitting element 1. The plurality of light-emitting elements 1 are arranged in a matrix shape on the first substrate 10 at predetermined intervals. The number of light-emitting elements 1 can be in a range from 1000 to 20000, for example. The size and the number of the light-emitting elements 1 can be selected as appropriate depending on the form of the light-emitting device. For example, when a relatively small element placement region is controlled by a larger number of divisions, a larger number of smaller light-emitting elements 1 are preferably disposed at a high density.

As the light-emitting element 1, one that emits light with any applicable wavelength can be used. For example, as the light-emitting element 1 that emits blue light and green light, one using a nitride semiconductor $In_XAl_YGa_{1-X-Y}N$ ($0 \leq X$, $0 \leq Y$, $X+Y \leq 1$) can be used. As the light-emitting element 1 that emits red light, for example, a semiconductor represented by GaAlAs or AlInGaP can be used. The emission color of the light-emitting element 1 can be selected as appropriate in accordance with an intended purpose.

When the light-emitting element 1 and the first substrate 10 are bonded to each other, a bump made of a metal material such as Au, Ag, Cu, and Al can be used as a bonding member. As the bonding member, a solder material such as an AuSn-based alloy and an Sn-based lead-free solder may also be used. As the bonding member, a conductive bonding material in which conductive particles are contained in a resin can also be used. The light-emitting element 1 and the first substrate 10 may also be bonded to each other by forming a bonding member between the light-emitting element 1 and the first substrate 10 by using a plating method. For example, Cu can be used as the plating material. The light-emitting element 1 and the first substrate 10 may also be bonded to each other by direct bonding of the electrodes of the light-emitting element 1 and the wiring lines of the first substrate 10 without the intervention of a bonding member.

Figure 5:
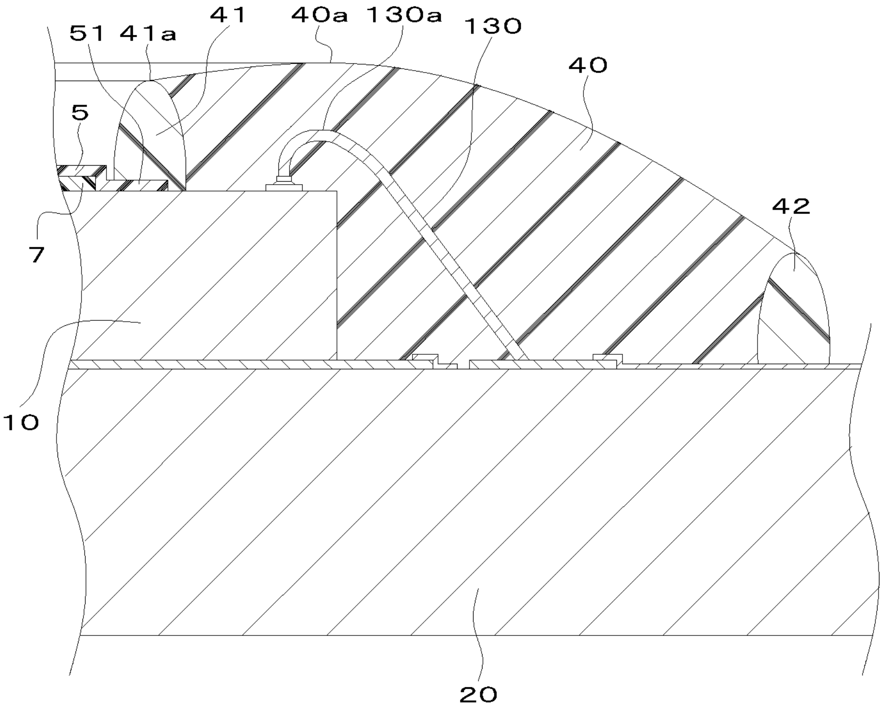
FIG. 5 schematically illustrates a cross-sectional view of a portion of the light-emitting device taken along line V-V in FIG. 2.
Figure 7:
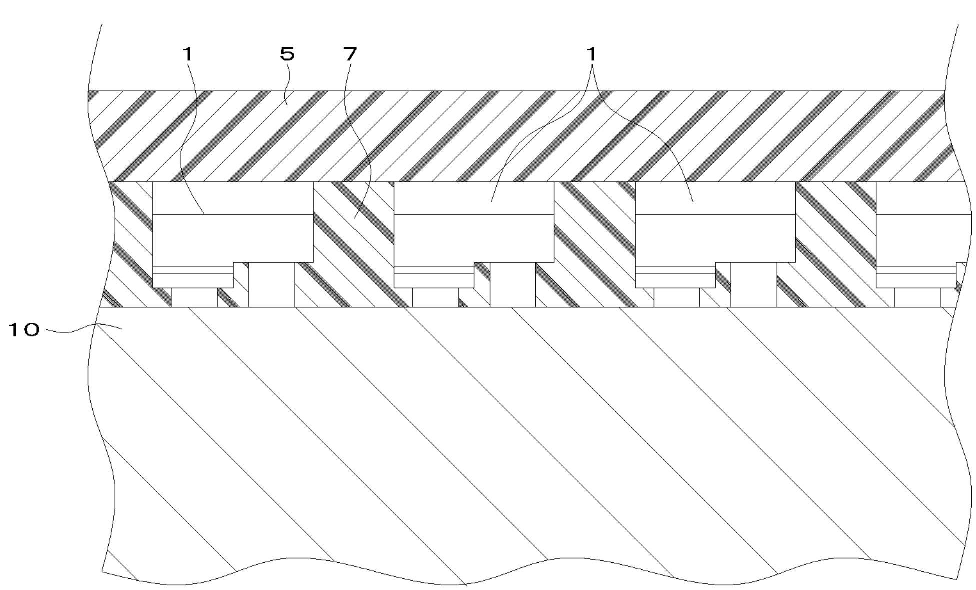
FIG. 7 schematically illustrates a cross-sectional view of a portion of the light-emitting device taken along line VII-VII in FIG. 2.

As illustrated in FIG. 7, the reflective member 7 covers the upper surface of the first substrate 10 and the lateral surfaces of the light-emitting elements 1. The upper surface of the light-emitting element 1 is not covered with the reflective member 7. The reflective member 7 may also be disposed between the lower surfaces of the light-emitting elements 1 and the first substrate 10. The reflective member 7 can reflect light emitted from the lateral surfaces of the light-emitting elements 1 toward the upper surface of the light-transmissive member 5 and improve the light emission efficiency of the light-emitting device 100. When the plurality of light-emitting elements 1 are individually lit, the reflective member 7 can clarify the boundary between a light-emitting region and a non-light-emitting region and improve the contrast ratio of the luminance in the light-emitting region with respect to that in the non-light-emitting region. As illustrated in FIG. 5, the reflective member 7 is spaced apart from the first covering member 41. The reflective member 7 may be disposed in contact with the first covering member 41.

For the reflective member 7, a soft resin having relatively low elasticity and excellent shape-following capability is preferably used. Specifically, a resin in which particles of a light reflective material are contained is preferably used for a resin serving as the base material of the reflective member 7. Examples of the resin that can be used include a silicone resin, a modified silicone resin, an epoxy resin, a modified epoxy resin, an acrylic resin, and a resin such as a hybrid resin containing at least one of these resins. Among these, a silicone resin having excellent heat resistance and light resistance is preferably used, and a dimethyl silicone resin is more preferably used. The dimethyl silicone resin has high reliability such as higher temperature resistance and the like, and thus can be suitably used as a material for vehicle-mounted applications. Examples of the light reflective material that can be suitably used include titanium oxide, aluminum oxide, zinc oxide, barium carbonate, barium sulfate, boron nitride, aluminum nitride, and glass filler. The reflective member 7 may contain a light-absorbing material such as carbon black, graphite, and titanium black.

Figure 3:
FIG. 3 schematically illustrates a cross-sectional view of the light-emitting device taken along line III-III in FIG. 2.
Figure 3:
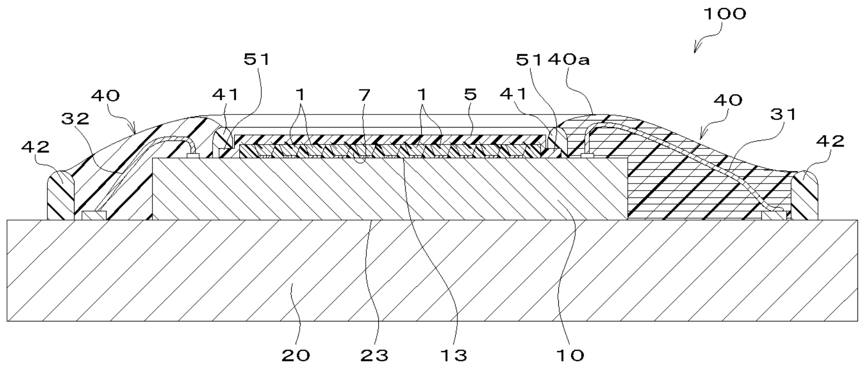
Figure 4:
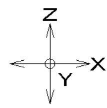
FIG. 4 schematically illustrates a cross-sectional view of the light-emitting device taken along line IV-IV in FIG. 2.
Figure 4:
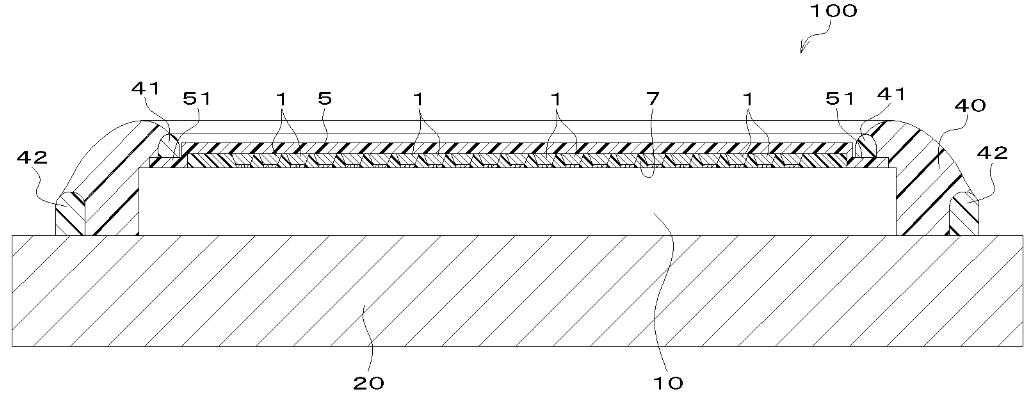

The light-transmissive member 5 has translucency and covers the upper surfaces of the plurality of light-emitting elements 1. As illustrated in FIGS. 3 and 4, the light-transmissive member 5 continuously covers the upper surfaces of the plurality of light-emitting elements 1 and the upper surface and lateral surfaces of the reflective member 7. Light emitted from each of the plurality of light-emitting elements 1 passes through the light-transmissive member 5 and is mainly emitted from the upper surface of the light-transmissive member 5.

Figure 6:
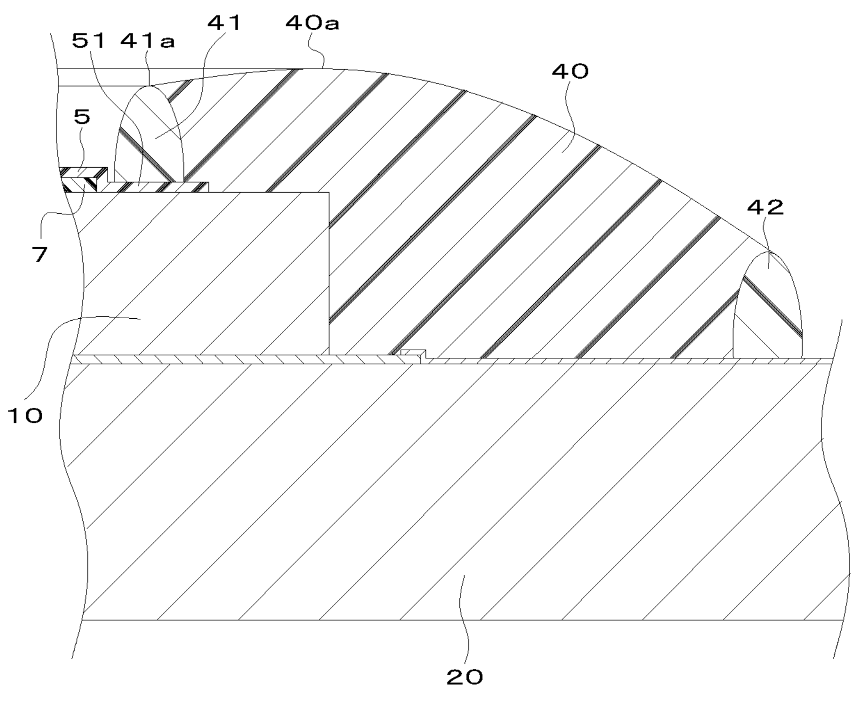
FIG. 6 schematically illustrates a cross-sectional view of a portion of the light-emitting device taken along line VI-VI in FIG. 2.

As illustrated in FIGS. 1 and 2, a planar view shape of the light-transmissive member 5 is, for example, rectangular. In case the planar view shape of the light-transmissive member 5 is rectangular having a long side and a short side, for example, the length of the long side can be in a range from 10 mm to 20 mm and the length of the short side can be in a range from 3 mm to 7 mm. As illustrated in FIGS. 5 and 6, at least one outer edge (e.g., each outer edge) 51 of the lower surface of the light-transmissive member 5 is in contact with the upper surface of a portion of the first substrate 10 located outside the element placement region 13. A part of the light-transmissive member 5 is covered with the first covering member 41. That is, a part of the light-transmissive member 5 is located between the upper surface of the first substrate 10 and the first covering member 41. According to such a configuration, the adhesion between the light-transmissive member 5 and the first substrate 10 is improved, and the light-transmissive member 5 is less likely to be peeled off from the first substrate 10, so that a highly reliable light-emitting device can be achieved.

As illustrated in FIG. 5, an outer edge 51 along the long side of the light-transmissive member 5 is covered with the first covering member 41 and is not located outside the first covering member 41. As illustrated in FIG. 6, a part of an outer edge 51 along the short side of the light-transmissive member 5 is located outside the first covering member 41 and is in contact with the resin member 40. According to such a configuration, a bonding area between the light-transmissive member 5 and the first substrate 10 is increased and the light-transmissive member 5 is less likely to peel off from the first substrate 10, so that a highly reliable light-emitting device can be achieved. It is noted that all the outer edges 51 of the light-transmissive member 5 may not be located outside the first covering member 41 or may be located outside the first covering member 41.

The light-transmissive member 5 may include a resin serving as a base material thereof and contain a wavelength conversion member in the base material. In the present embodiment, the light-transmissive member 5 includes the wavelength conversion member, and a part of light emitted from the light-emitting element 1 is wavelength-converted by the wavelength conversion member and emitted to the outside. The resin used as the base material of the light-transmissive member 5 has high translucency with respect to a wavelength of the light emitted from the light-emitting element 1. The resin used as the base material of the light-transmissive member 5 preferably has a light transmittance of, for example, 60% or more, preferably 70% or more with respect to the wavelength of the light emitted from the light-emitting element 1. Examples of the light-transmissive member 5 containing the wavelength conversion member include a member containing a phosphor powder in the resin serving as the base material. As the base material, a resin similar to the resin used for the base material of the reflective member 7 described above can be used. The thickness of the light-transmissive member 5 can be in a range from 20 μm to 100 μm, for example.

Examples of the phosphor that can be used include an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)_6Cl_2$:Eu), an SAE based phosphor (for example, $Sr_4Al_{14}O_{25}$:Eu), a chlorosilicate based phosphor (for example, $Ca_8MgSi_4O_{16}Cl_2$:Eu), a nitride based phosphor such as a β-SiAlON based phosphor (for example, $(Si,Al)_3(O,N)_4$:Eu), an α-SiAlON based phosphor (for example, $Ca(Si,Al)_{12}(O,N)_{16}$:Eu), an SLA based phosphor (for example, $SrLiAl_3N_4$:Eu), a CASN based phosphor (for example, $CaAlSiN_3$:Eu), or an SCASN based phosphor (for example, $(Sr,Ca)AlSiN_3$:Eu), a fluoride based phosphor such as a KSF based phosphor (for example, $K_2SiF_6$:Mn), a KSAF based phosphor (for example, $K_2(Si,Al)F_6$:Mn) or an MGF based phosphor (for example, $3.5MgO \cdot 0.5MgF_2 \cdot GeO_2$:Mn), a phosphor having a perovskite structure (for example, $CsPb(F,Cl,Br,I)_3$), or a quantum dot phosphor (for example, CdSe, InP, $AgInS_2$, or $AgInSe_2$).

As illustrated in FIGS. 1 to 4, the resin member 40 is in contact with the first covering member 41 and the second covering member 42 and covers the upper surface of a portion of the first substrate 10 located outside the first covering member 41. The resin member 40 also covers the wires 130 located outside the element placement region 13. The resin member 40, for example, surrounds the element placement region 13 in a plan view.

In a plan view (e.g., FIG. 2 and FIG. 9G described below), the width of a portion of the resin member 40 located on the long side of the first substrate 10 is wider than the width of a portion of the resin member 40 located on the short side of the first substrate 10. The height of the resin member 40 is highest at a portion directly above a top portion 130*a* of the wire 130. A top portion 40*a* of the resin member 40 is located above a top portion 41*a* of the first covering member 41. The height of the resin member 40 here is a distance from the upper surface of the second substrate 20 to the upper surface of the resin member 40.

Examples of the resin member 40 include a resin containing a filler having a light shielding property. Examples of the resin serving as a base material of the resin member 40 that can be used include a silicone resin, a modified silicone resin, an epoxy resin, a modified epoxy resin, and an acrylic resin. Examples of the filler having a light shielding property include a light-absorbing material such as pigments, carbon black, graphite, and titanium black, and a light reflective material similar to the light reflective material included in the reflective member described above. In consideration of deterioration of the resin due to light absorption, a resin having light reflectivity is preferably used for the outermost surface of the resin member 40.

As illustrated in FIGS. 3 and 4, the first covering member 41 is continuously disposed on the upper surface of the first substrate 10 and the upper surface of the light-transmissive member 5. The first covering member 41 is disposed along the outer edges of the upper surface of the light-transmissive member 5. Specifically, the first covering member 41 is disposed along the outer edges of the upper surface of the light-transmissive member 5 on a portion of the first substrate 10 between the element placement region 13 and the first terminals 110. According to such a configuration, the adhesion between the light-transmissive member 5 and the first substrate 10 can be improved, and the light-emitting device 100 with high reliability can be achieved. Because the upper surface of the first substrate 10 is not exposed in a region surrounded by the first covering member 41, the wiring lines and the like disposed in the element placement region 13 can be protected from dust, moisture, external forces, and the like. With this structure, the light-emitting device 100 having higher reliability can be achieved.

As illustrated in FIGS. 1 and 2, the first covering member 41 surrounds the element placement region 13 in the plan view. Alternatively, in the plan views, the first covering member 41 need not surround the element placement region 13, and for example, may be disposed linearly along two opposing sides of the light-transmissive member.

As illustrated in FIGS. 1 and 2, the second covering member 42 is in contact with the resin member 40 on the upper surface of the second substrate 20. The second covering member 42 surrounds the first substrate 10 and the second terminals 120 in the plan view.

For the first covering member 41 and the second covering member 42, a material that transmits or blocks light emitted from the light-emitting elements 1 can be used. For the first covering member 41 and the second covering member 42, a material used for the base material of the resin member 40 described above can be used. For the first covering member 41, a material that transmits light emitted from the light-emitting elements 1 is preferably used. According to such materials, the generation of stray light in the light-emitting device 100 due to reflection of light directed from the light-emitting elements 1 toward the first covering member 41 can be reduced. When a resin is used for the first covering member 41 and the second covering member 42, a resin with higher viscosity than the resin member 40 is preferably used. The viscosity of the resin can be adjusted by, for example, the amount of a filler contained in the resin.

As illustrated in FIGS. 3 and 4, the resin member 40 is continuously disposed on the upper surface of the first substrate 10 and the upper surface of the second substrate 20. In the plan view, the resin member 40 is disposed between the first covering member 41 and the second covering member 42. That is, the resin member 40 is disposed between the first covering member 41 that is disposed on the first substrate 10 to surround the element placement region 13 and the second covering member 42 that is disposed on the second substrate 20 to surround the substrate placement region 23. For example, the resin member 40 is disposed in contact with the top portion of each of the first covering member 41 and the second covering member 42.

The light-emitting device 100 having the above configuration can be used as a light source for a headlight of a vehicle, for example. In the configuration of this case, light is irradiated from the light source to the outside via a lens. In the light-emitting device 100, lighting of the light-emitting elements 1 is controlled by an external power switch. The light-emitting device 100 is configured such that a part or all of preset light-emitting elements 1 can be individually lit.

Method for Manufacturing Light-Emitting Device

Figure 8:
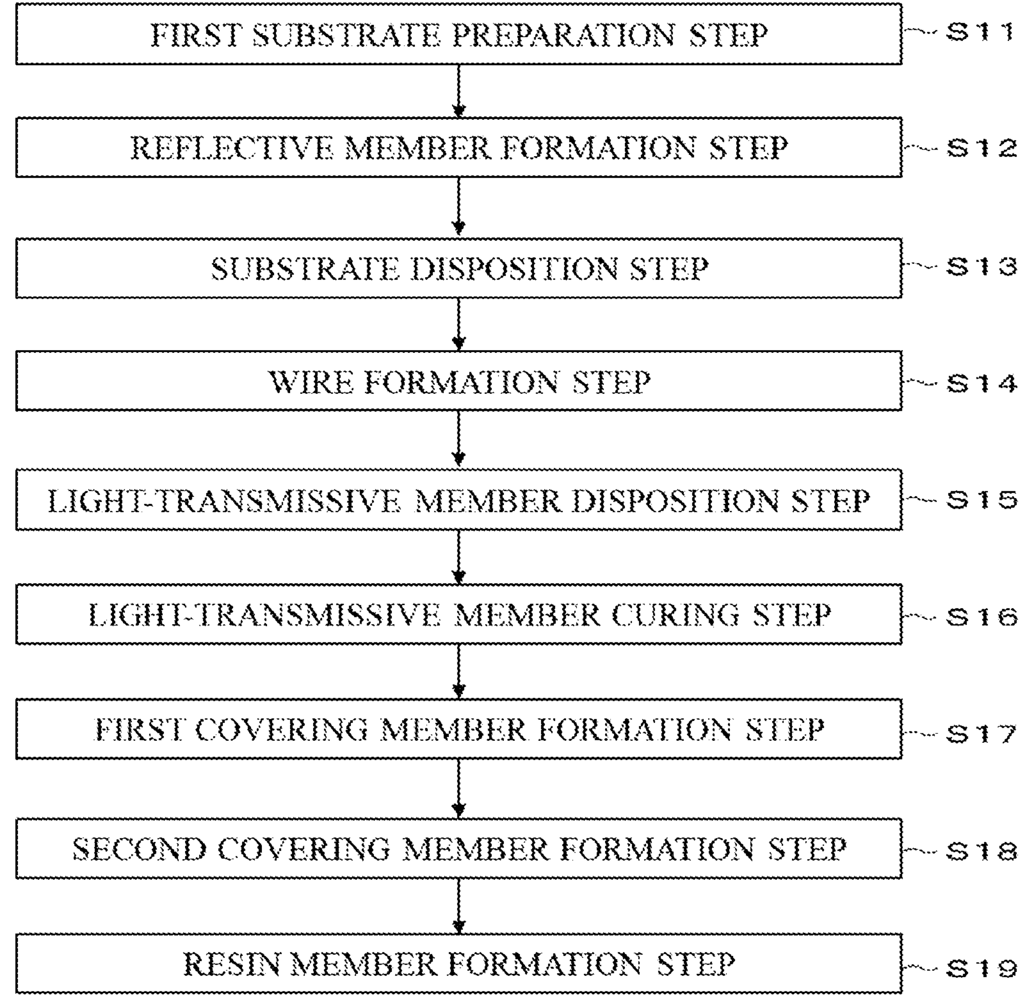
FIG. 8 is a flowchart of a method for manufacturing a light-emitting device according to an embodiment.

A method for manufacturing the light-emitting device of the present embodiment is described with reference to FIGS. 8, 9A to 9H, 10A to 10C, 11, and 12. FIG. 8 is a flowchart of the method for manufacturing the light-emitting device of the present embodiment.

The method for manufacturing the light-emitting device includes a first substrate preparation step S11 of preparing the first substrate 10 including the element placement region 13 on the upper surface thereof and the plurality of light-emitting elements 1 disposed in the element placement region 13, a light-transmissive member disposition step S15 of disposing the light-transmissive member 5 having a rectangular shape in a plan view and being uncured to cover the plurality of light-emitting elements 1 and pressing regions R of the light-transmissive member 5 each located around a corresponding one of four corners of the light-transmissive member 5 to bring a part of the lower surface of the light-transmissive member 5 into contact with the upper surface of a portion of the first substrate 10 located outside the element placement region 13, and a light-transmissive member curing step S16 of curing the light-transmissive member 5 after the light-transmissive member disposition step S15.

The method for manufacturing the light-emitting device may further include a reflective member formation step S12 of forming the reflective member 7 covering the lateral surfaces of the plurality of light-emitting elements 1.

The method for manufacturing the light-emitting device may further include a first covering member formation step S17 of forming, along the outer edges of the light-transmissive member 5, the first covering member 41 continuously on the upper surface of the first substrate 10 and on the upper surface of the light-transmissive member 5 after the light-transmissive member curing step S16. The light-transmissive member disposition step S15 may further include a step of preparing the light-transmissive member 5 in which a protective sheet 50 is disposed on the light-transmissive member 5. The method for manufacturing the light-emitting device may further include a protective sheet removal step of removing the protective sheet 50, from the light-transmissive member 5, starting from a portion of the protective sheet 50 located at a corner of the light-transmissive member 5 after the light-transmissive member disposition step S15.

The method for manufacturing the light-emitting device may further include a second substrate preparation step of preparing the second substrate 20, a substrate disposition step S13 of disposing the first substrate 10 on the second substrate 20, a wire formation step S14 of forming the wires 130 electrically connecting the first substrate 10 and the second substrate 20, a second covering member formation step S18 of forming the second covering member 42, and a resin member formation step S19 of forming the resin member 40 covering the wires 130. Both the first covering member formation step S17 and the second covering member formation step S18 may be performed regardless of order or concurrently performed.

Each step is described below.

Figure 9A:
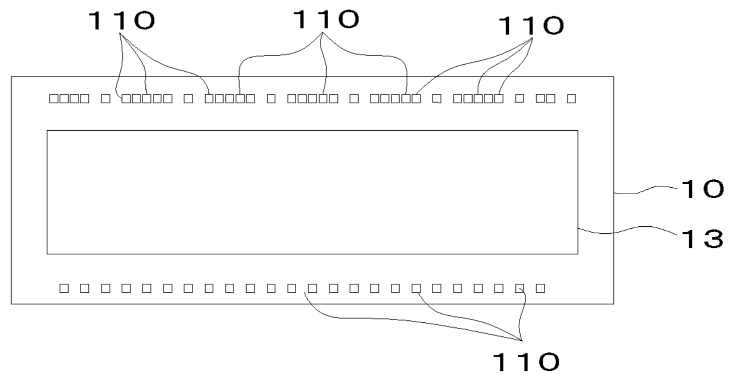
FIGS. 9A-9H are plan view diagrams for illustrating steps of a method for manufacturing a light-emitting device according to an embodiment.
Figure 9B:
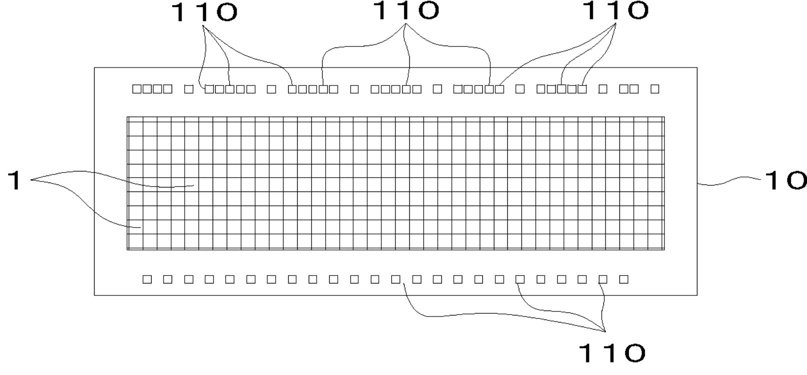

The first substrate preparation step S11 is a step of preparing the first substrate 10 in which the plurality of light-emitting elements 1 are disposed in the element placement region 13, as illustrated in FIG. 9B. As illustrated in FIG. 9A, the first substrate 10 in which the plurality of first terminals 110 and the wiring lines are disposed in advance on the element placement region 13 and around the element placement region 13 is preferably prepared as the first substrate 10. The first terminals 110 and the wiring lines can be formed by, for example, a plating method, a sputtering method, a vapor deposition method, or the like. The plurality of light-emitting elements 1 can be mounted on the element placement region 13 by flip-chip mounting, for example. The light-emitting element 1 can be formed by performing a plurality of steps such as a step of forming a semiconductor layered body and a step of forming an electrode on a semiconductor layer. The first substrate 10 may be prepared by purchasing it.

Figure 9C:
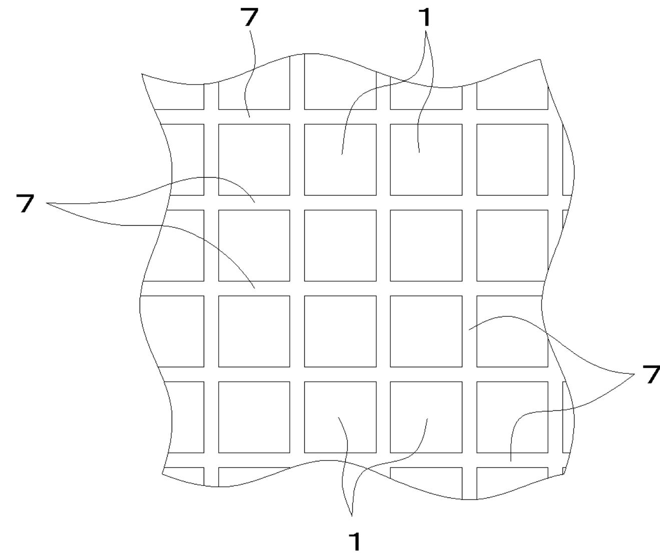

The reflective member formation step S12 is a step of forming the reflective member 7 covering the lateral surfaces of the plurality of light-emitting elements 1. After the plurality of light-emitting elements 1 are disposed on the first substrate 10, the reflective member 7 is formed to cover the lateral surfaces of the plurality of light-emitting elements 1. In the reflective member formation step S12, the reflective member 7 is disposed between the plurality of light-emitting elements 1 as illustrated in FIG. 9C. The reflective member 7 can be formed by, for example, compression molding, transfer molding, potting, printing, spraying, or the like.

Figure 9D:
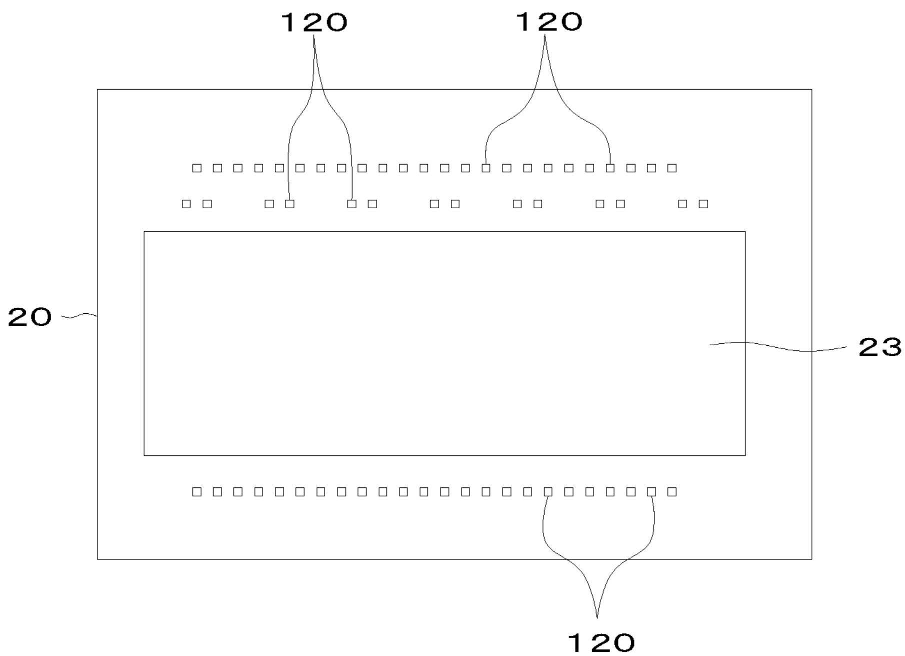
Figure 9E:
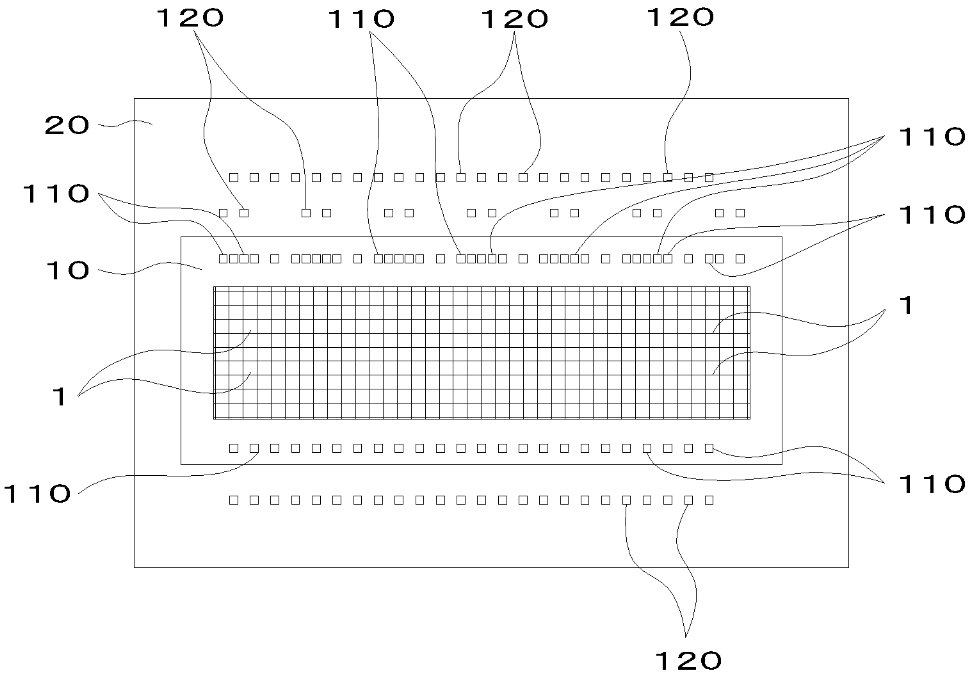

The substrate disposition step S13 is a step of disposing the first substrate 10 on which the plurality of light-emitting elements 1 are disposed in the substrate placement region 23 of the second substrate 20 as illustrated in FIG. 9E. In the substrate disposition step S13, the first substrate 10 is bonded to the substrate placement region 23 of the second substrate 20. The first substrate 10 and the second substrate 20 can be bonded to each other via, for example, a bonding member by disposing the bonding member between the first substrate 10 and the second substrate 20. As illustrated in FIG. 9D, the second substrate 20 on which the plurality of second terminals 120 are disposed in advance is preferably prepared before performing the substrate disposition step S13. The second terminals 120 can be formed by a method similar to that of the first terminals 110 of the first substrate 10 described above. The second substrate 20 may be prepared by purchasing it.

Figure 9F:
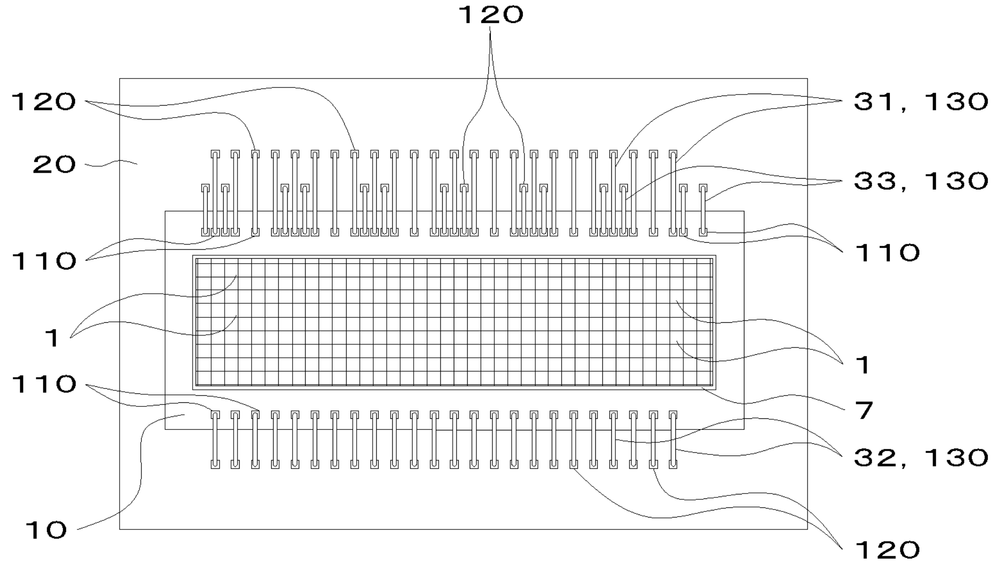

The wire formation step S14 is a step of connecting the first terminals 110 of the first substrate 10 and the second terminals 120 of the second substrate 20 by the wires 130 as illustrated in FIG. 9F. The wires 130 are preferably connected to the second terminals 120 on the second substrate 20 after being connected to the first terminals 110 on the first substrate 10. This can make it easier to form the wires 130 along a step difference between the first substrate 10 and the second substrate 20. As a result, in the resin member formation step S19 to be described below, the amount of resin disposed between the wires 130 and the second substrate 20 can be reduced, and disconnection of the wires 130 due to thermal expansion of the resin member 40 can be reduced.

Figure 9G:
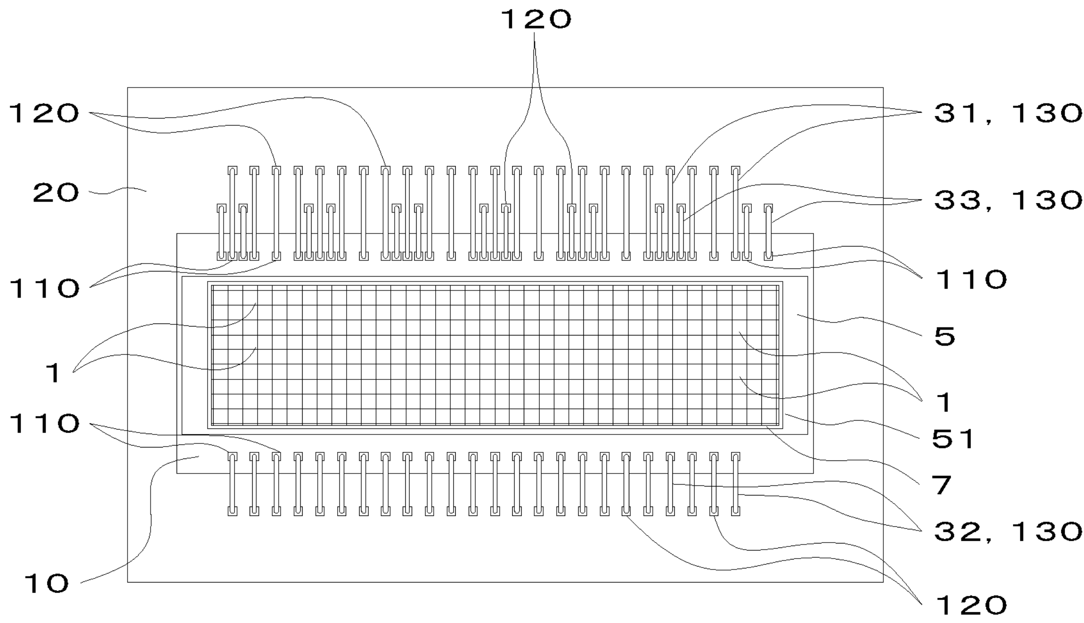

The light-transmissive member disposition step S15 is a step of disposing the light-transmissive member 5 covering the plurality of light-emitting elements 1 and the reflective member 7, as illustrated in FIG. 9G. The light-transmissive member 5 has a rectangular shape in the plan view and is in an uncured state. The light-transmissive member disposition step S15 may include a step of preparing a sheet member including the light-transmissive member 5 and the protective sheet 50 disposed on the light-transmissive member 5. A planar view shape of the protective sheet 50 is, for example, rectangular. In the plan view, the outer shape of the protective sheet 50 is substantially the same as the outer shape of the light-transmissive member 5. When the light-transmissive member 5 is attached onto the plurality of light-emitting elements 1, the adhesion between the light-transmissive member 5 and the light-emitting element 1 is preferably higher than the adhesion between the light-transmissive member 5 and the protective sheet 50. This makes it easy to remove the protective sheet 50 from the light-transmissive member 5 in the step of removing the protective sheet 50 to be described below. A material with low adhesiveness is preferably used for the protective sheet 50, and for example, a resin such as polyethylene terephthalate (PET) can be used.

Figure 10A:
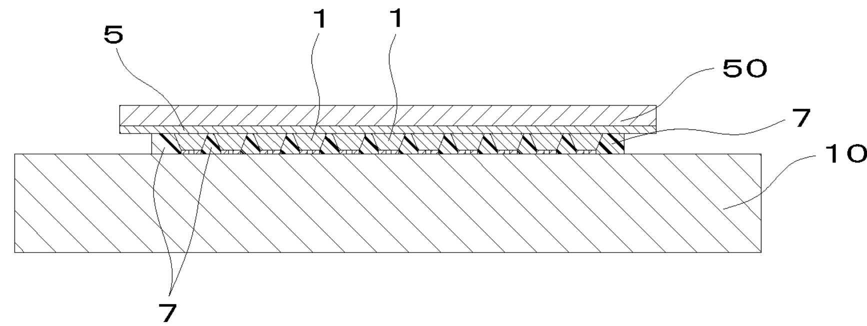
FIGS. 10A-10C are cross-sectional diagrams for illustrating a light-transmissive member disposition step of a method for manufacturing a light-emitting device according to an embodiment.

In the light-transmissive member disposition step S15, first, as illustrated in FIG. 10A, the light-transmissive member 5 is disposed to cover the plurality of light-emitting elements 1. The light-transmissive member 5 may be attached onto the plurality of light-emitting elements 1 via a light-transmissive bonding member such as a resin or may be attached onto the plurality of light-emitting elements 1 by the adhesiveness or the like of the light-transmissive member 5 without a bonding member therebetween. When the light-transmissive member 5 is disposed on the light-emitting element 1, a jig such as a collet that can suck the light-transmissive member 5 may be used.

The light-transmissive member 5 is preferably disposed on the plurality of light-emitting elements 1 in a state in which a part of the outer edges of the light-transmissive member 5 is in contact with the upper surface of the first substrate 10. For example, when the light-transmissive member 5 is disposed on the light-emitting elements 1, a part of the outer edges 51 of the light-transmissive member 5 may be brought into contact with the upper surface of the first substrate 10 by pressing a portion of the outer edges 51 along the short side of the light-transmissive member 5 among the outer edges 51 of the light-transmissive member 5 by using a jig such as a collet. Thus, the light-transmissive member 5 can be more firmly bonded to the first substrate 10. Preferably, a portion of the outer edges 51 along the long side of the light-transmissive member 5 among the outer edges 51 of the light-transmissive member 5 is not pressed by a jig such as a collet and is not in contact with the upper surface of the first substrate 10. Thus, in the light-transmissive member curing step S16 to be described below, air is discharged from a region (may be referred to as "non-contact region") along the long side of the light-transmissive member 5 and is less likely to remain between the light-transmissive member 5 and the first substrate 10 than when both the long side edges and the short side edges of the light-transmissive member 5 are in contact with the upper surface of the first substrate 10. This makes it possible to reduce deterioration of the bonding property between the light-transmissive member 5 and the first substrate 10 due to the bonding between the first substrate 10 and the light-transmissive member 5 in a state in which air remains and to improve reliability of the light-emitting device 100.

Figure 10B:
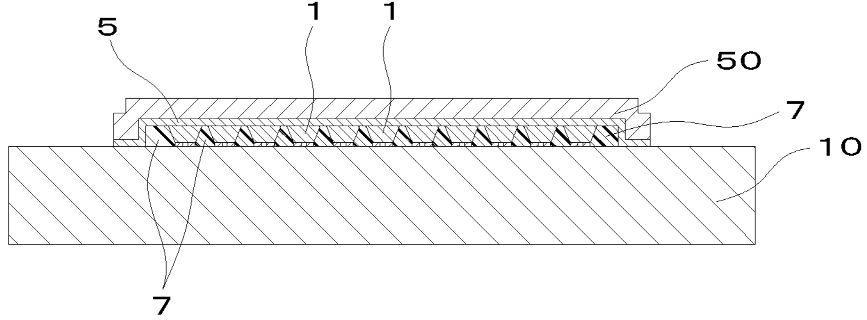
Figure 11:
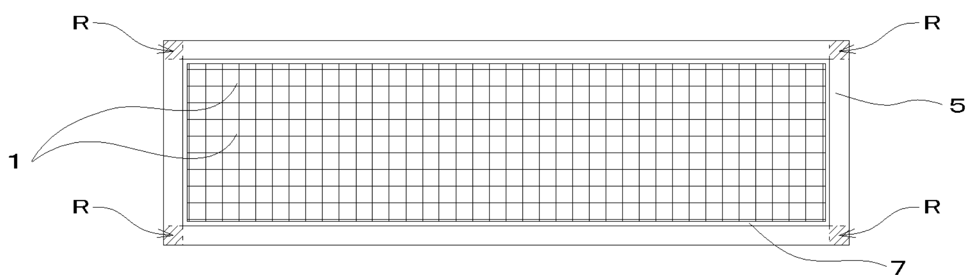
FIG. 11 is a plan view diagram for illustrating a light-transmissive member disposition step of a method for manufacturing a light-emitting device according to an embodiment.
Figure 12:
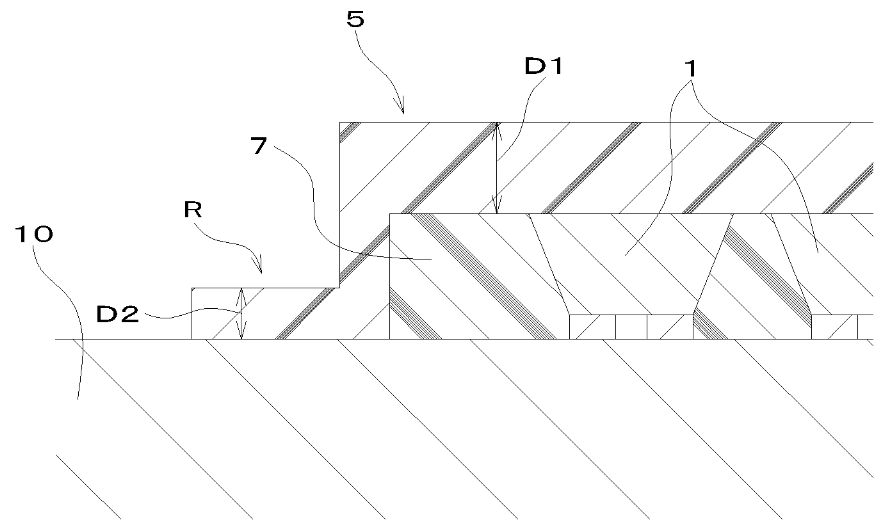
FIG. 12 is an enlarged cross-sectional diagram for illustrating a light-transmissive member disposition step of a method for manufacturing a light-emitting device according to an embodiment.

Subsequently, by selectively pressing the regions R (shown in FIG. 11) located around the four corners of the light-transmissive member 5, a part of the lower surface of the light-transmissive member 5 is brought into contact with the upper surface of a portion of the first substrate 10 located outside the element placement region 13, as illustrated in FIG. 10B (if the regions R have not been sufficiently in contact with the upper surface of the first substrate 10 through the pressing with the jig described above). The region R located at the corner of the light-transmissive member 5 is a region of the outer edge 51 of the light-transmissive member 5 that is particularly more likely to be peeled off from the first substrate 10 in the light-transmissive member curing step S16 to be described below. By bringing the lower surface of the region R of the light-transmissive member 5 into contact with the first substrate 10, the light-transmissive member 5 is less likely to be peeled off from the first substrate in the light-transmissive member curing step S16 to be described below, so that the light-emitting device 100 with high reliability can be achieved. As illustrated in FIG. 11, the regions R located at the four corners of the light-transmissive member 5 are regions located outside the reflective member 7 and adjacent to the corners of the light-transmissive member 5 in the plan view. As illustrated in FIG. 12, a thickness D2 of the light-transmissive member 5 in the pressed region R is less than a thickness D1 of the light-transmissive member 5 in a region covering right above the light-emitting elements 1. As the pressing member for pressing the region R of the light-transmissive member 5, for example, a member having a pointed tip or a member of which portion that presses the light-transmissive member 5 is circular or polygonal can be used. All the four regions R of the light-transmissive member 5 may be pressed or only three or less of the four regions R of the light-transmissive member 5 may be pressed.

Preferably, regions (e.g., edges) including the regions R of the light-transmissive member 5 are pressed by a jig such as a collet to contact the first substate 10, and then the regions R of the light-transmissive member 5 are further pressed. That is, the regions R of the light-transmissive member 5 preferably overlap the regions pressed by the jig such as a collet. By further pressing the regions R of the light-transmissive member 5 in a state in which the regions R of the light-transmissive member 5 are in contact with the first substrate 10 due to the pressing by the jig, the regions R of the light-transmissive member 5 can be pressed toward the first substrate 10 with higher positional accuracy than when the regions R of the light-transmissive member 5 are not in contact with the first substrate 10.

The regions R located at the four corners of the light-transmissive member are preferably pressed via the protective sheet 50. Thus, the light-transmissive member 5 is less likely to be damaged due to direct contact between the pressing member used for pressing and the light-transmissive member 5.

In the light-transmissive member disposition step S15, it is preferable that each of the regions R of the light-transmissive member 5 is selectively pressed. That is, in the selective pressing of the light-transmissive member disposition step S15, it is preferable that a portion of the outer edges 51 along the long side among the outer edges 51 of the light-transmissive member 5, including the regions R, is not pressed altogether. Thus, because the light-transmissive member curing step S16 to be described below is performed in a state in which the portion of the outer edges 51 of the light-transmissive member 5 along the long side is not in contact with the first substrate 10, the first substrate 10 and the light-transmissive member 5 are less likely to be bonded to each other in a state in which air remains as described above. This makes it possible to reduce deterioration of the bonding property between the light-transmissive member 5 and the first substrate 10 and to improve reliability of the light-emitting device 100. Alternatively, in the light-transmissive member disposition step S15, a part of the portion of the outer edges 51 along the long side among the outer edge 51 of the light-transmissive member 5, including the regions R, may be pressed.

Figure 10C:
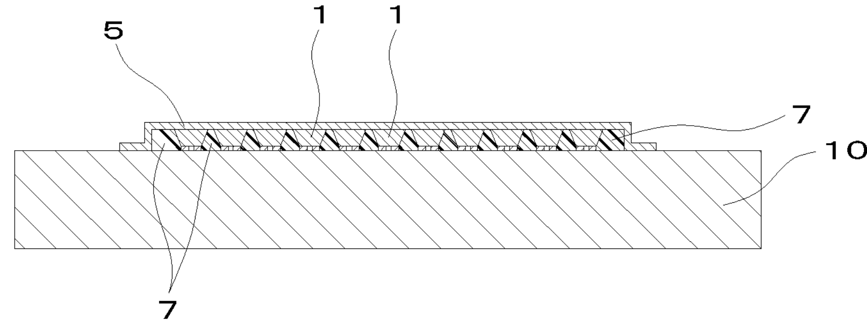

When the light-transmissive member 5 having the protective sheet 50 is used, a protective sheet removal step of removing the protective sheet 50 may be performed after the light-transmissive member disposition step S15 as illustrated in FIG. 10C. To remove the protective sheet 50, for example, a method of abutting an adhesive member having adhesiveness against the protective sheet 50 and them moving in a direction away from the light-transmissive member 5, or a method of picking up a part of the protective sheet 50 by a tweezer or the like and moving the tweezer in a direction away from the light-transmissive member 5 can be used.

By pressing the light-transmissive member 5 and bringing the light-transmissive member 5 into contact with the first substrate 10, the adhesion force between the light-transmissive member 5 and the first substrate 10 becomes higher than the adhesion force between the light-transmissive member 5 and the protective sheet 50, and thus a portion of the protective sheet 50 located above the regions R of the pressed light-transmissive member 5 is in a state of being easily peeled off from the light-transmissive member 5. Thus, the protective sheet 50 is preferably removed starting from a portion of the protective sheet 50 located above one or more of the regions R (e.g., one region R at a corner or two regions R along an edge) of the light-transmissive member 5. The protective sheet removal step is preferably performed before the light-transmissive member curing step S16 to be described below. According to such a manner of pressing before the light-transmissive member curing step S16 to be described below, the adhesion between the light-transmissive member 5 and the protective sheet 50 is less likely to increase, and the protective sheet 50 is easily removed from the light-transmissive member 5.

The light-transmissive member curing step S16 is a step of curing the light-transmissive member 5. The uncured light-transmissive member 5 is softened by heating or the like and deformed along the shape of the reflective member 7, so that each outer edge 51 of the light-transmissive member 5 can come into contact with the upper surface of the first substrate 10. Subsequently, by heating the light-transmissive member 5 at a higher temperature than that when softening the light-transmissive member 5, the light-transmissive member 5 is cured and bonded to the upper surface of the first substrate 10. When the light-transmissive member 5 is cured, the outer edges 51 of the light-transmissive member 5 are likely to warp in a direction away from the upper surface of the first substrate 10, and in particular, the corners of the light-transmissive member 5 are more likely to warp than the other regions of the light-transmissive member 5. In the present embodiment, as described above, the regions R located at the corners of the light-transmissive member 5 are brought into contact with the upper surface of the first substrate 10 before the light-transmissive member curing step S16. Thus, in the light-transmissive member curing step S16, peeling off of the light-transmissive member 5 from the first substrate 10 can be reduced, so that a highly reliable light-emitting device can be achieved.

Figure 9H:
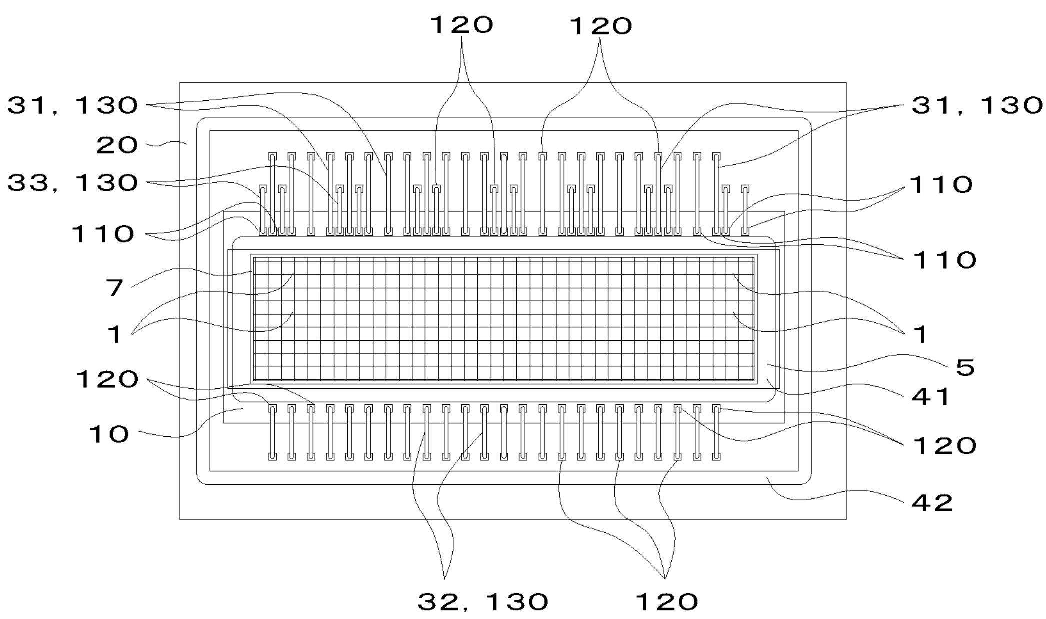

The first covering member formation step S17 is a step of forming the first covering member 41 continuously on the upper surface of the first substrate 10 and on the upper surface of the light-transmissive member 5 as illustrated in FIG. 9H. The first covering member 41 is formed along the outer edges 51 of the light-transmissive member 5 in the planar view. For the first covering member 41, for example, by moving a nozzle of a dispenser while supplying an uncured resin from the nozzle, the first covering member 41 can be formed along the outer edges 51 of the light-transmissive member 5. The first covering member 41 is formed to be continuous on the upper surface of the first substrate 10 and on the upper surface of the pressed region R of the light-transmissive member 5.

The height of the light-transmissive member 5 is lower in an outer edge region where the light-transmissive member 5 and the upper surface of the first substrate 10 are in contact with each other than in a central region of the light-transmissive member 5 covering the plurality of light-emitting elements 1. The first covering member 41 is formed to cover a portion of the light-transmissive member 5 located in the outer edge region. This can suppress the uncured resin forming the first covering member 41 from creeping up to the central region of the light-transmissive member 5, when the first covering member 41 is supplied. It is noted that the height of the light-transmissive member 5 is a height from the upper surface of the first substrate 10 to the upper surface of the light-transmissive member 5.

The second covering member formation step S18 is a step of forming the second covering member 42 on the upper surface of a portion of the second substrate 20 outside the second terminals 120 as illustrated in FIG. 9H. The second covering member 42 is formed to surround the first substrate 10 and the second terminals 120 in the plan view. For the second covering member 42, for example, by moving the nozzle of the dispenser while supplying an uncured resin from the nozzle, the second covering member 42 can be formed to surround the first substrate 10 and the second terminals 120. From the viewpoint of simplifying the process, the same material is preferably used for the first covering member 41 and the second covering member 42.

The first covering member 41 and the second covering member 42 can be set to a predetermined height by providing a plurality of overlapping layers of the uncured resin in the height direction. For example, the first covering member 41 and the second covering member 42 can be set to a predetermined height by repeating a step of forming a resin adjusted to a predetermined viscosity from the nozzle on the substrate and forming a resin above the resin. The first covering member 41 and the second covering member 42 can be used as wall portions for retaining the uncured resin material in a region between the first covering member 41 and the second covering member 42 in the resin member formation step S19 to be described below.

The resin member formation step S19 is a step of forming the resin member 40 that is in contact with the first covering member 41 and the second covering member 42 outside the first covering member 41 and that covers the wires 130. The resin member 40 is formed by supplying an uncured resin between the first covering member 41 and the second covering member 42 in the plan view. The resin member 40 is formed by using, for example, a resin with a lower viscosity than that of the first covering member 41 and the second covering member 42. The resin member 40 is disposed continuously on the upper surface and lateral surfaces of the first substrate 10 and on the upper surface of the second substrate 20.

The top portion 40*a* of the resin member 40 is preferably located higher than the top portion 41*a* of the first covering member 41. This can suppress the top portion 130*a* of the wires 130 located lower than the top portion 41*a* of the first covering member 41 from being not covered with the resin member 40 and exposed, and reliability of the light-emitting device 100 can be improved.

The light-emitting device and the method for manufacturing the light-emitting device according to the present invention have been specifically described in Description of Embodiments, but the spirit of the present invention is not limited to these descriptions and is to be broadly construed based on the claims. In addition, it is needless to say that various modifications, variations, and the like based on this description are also included within the spirit of the present invention.

What is claimed is:

1. A method for manufacturing a light-emitting device, the method comprising:

preparing a substrate including a plurality of light-emitting elements disposed in an element placement region of the substrate that is on an upper surface thereof;

disposing a light-transmissive member to cover the plurality of light-emitting elements, the light-transmissive member having a rectangular shape in a plan view and being uncured;

after said disposing the light-transmissive member, pressing one or more corner regions of the light-transmissive member, such that a part of a lower surface of the light-transmissive member is in contact with the upper surface of the substrate outside the element placement region; and after said pressing the one or more corner regions, curing the light-transmissive member.

2. The method according to claim 1, wherein said pressing the one or more corner regions comprises pressing each corner region of the light-transmissive member.

3. The method according to claim 1, further comprising:

after said disposing the light-transmissive member, pressing one or more outer edge portions of the light-transmissive member toward the upper surface of the substrate that is located outside the element placement region, wherein said pressing the one or more corner regions is carried out after said pressing one or more outer edge portions of the light-transmissive member.

4. The method according to claim 3, wherein said pressing one or more outer edge portions of the light-transmissive member comprises pressing two outer edge portions of the light-transmissive member on short sides, and not any outer edge portions of the light-transmissive member on long sides.

5. The method according to claim 3, wherein the one or more corner regions of the light-transmissive member are brought into contact with the upper surface of the substrate by said pressing one or more outer edge portions of the light-transmissive member.

6. The method according to claim 3, wherein said disposing the light-transmissive member is carried out using a jig for holding the light-transmissive member, the one or more outer edge portions of the light-transmissive member are pressed with the jig, and the one or more corner regions of the light-transmissive member are pressed with a tool different from the jig.

7. The method according to claim 3, wherein the one or more corner regions of the light-transmissive member overlap with the one or more outer edge portions of the light-transmissive member.

8. The method according to claim 1, wherein said disposing the light-transmissive member comprises:

preparing a sheet member including the light-transmissive member and a protective sheet disposed on the light-transmissive member; and disposing the sheet member to cover the plurality of light-emitting elements, such that the light-transmissive member faces the plurality of light-emitting elements, wherein the one or more corner regions of the light-transmissive member are pressed via the protective sheet.

9. The method according to claim 8, further comprising:

removing the protective sheet starting from a portion of the protective sheet located above at least one of the one or more corner regions of the light-transmissive member, after said disposing the sheet member.

10. The method according to claim 1, further comprising:

after said curing the light-transmissive member, forming a first covering member along at least an outer edge of the light-transmissive member, such that the first covering member is continuous on the upper surface of the substrate and on an upper surface of the light-transmissive member on the at least an outer edge.

11. The method according to claim 10, wherein the first covering member is continuous on the upper surface of the substrate and on the upper surface of the light-transmissive member at least on two outer edges of the light-transmissive member on long sides.

12. The method according to claim 10, wherein a part of the light-transmissive member is located between the substrate and the first covering member.

13. The method according to claim 1, wherein a thickness of the light-transmissive member at the one or more corner regions pressed is less than a thickness of the light-transmissive member above the plurality of light-emitting elements.

14. The method according to claim 1, wherein a width of a first edge portion of the light-transmissive member that is out of the plurality of light-emitting elements on a short side is greater than a width of a second edge portion of the light-transmissive member that is out of the plurality of light-emitting elements on a long side.

15. The method according to claim 14, wherein before said curing the light-transmissive member, the first edge portion of the light-transmissive member includes a non-contact region at which the light-transmissive member is not in contact with the upper surface of the substrate, and the non-contact region is brought into contact with the upper surface of the substrate by said curing the light-transmissive member.

16. The method according to claim 15, wherein air contained between the light-transmissive member and the plurality of light-emitting elements is discharged via the non-contact region during said curing the light-transmissive member.

17. The method according to claim 1, wherein the light-transmissive member comprises a wavelength conversion member.

18. The method according to claim 1, wherein a number of the light-emitting elements is in a range from 1000 to 20000.

* * * * *